(12) United States Patent
Kim et al.

(10) Patent No.: US 10,433,436 B2
(45) Date of Patent: Oct. 1, 2019

(54) FLEXIBLE DISPLAY DEVICE

(71) Applicant: Samsung Display Co., Ltd., Yongin-si, Gyeonggi-do (KR)

(72) Inventors: Youn Joon Kim, Yongin-si (KR); Sang Jae Kim, Yongin-si (KR); Se Bong Kim, Yongin-si (KR); Sol Bi Lee, Yongin-si (KR); Gyeong Ho Jeong, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/729,219

(22) Filed: Oct. 10, 2017

(65) Prior Publication Data

US 2018/0103553 A1  Apr. 12, 2018

(30) Foreign Application Priority Data

Oct. 11, 2016 (KR) ........................ 10-2016-0131565

(51) Int. Cl.
| | |
|---|---|
| H05K 3/00 | (2006.01) |
| G06F 1/16 | (2006.01) |
| H05K 5/00 | (2006.01) |
| G02B 5/20 | (2006.01) |
| H05K 7/20 | (2006.01) |
| H05K 9/00 | (2006.01) |
| H01L 51/00 | (2006.01) |
| G02F 1/1333 | (2006.01) |
| H04M 1/02 | (2006.01) |

(52) U.S. Cl.
CPC ............ *H05K 5/0017* (2013.01); *G02B 5/20* (2013.01); *G02F 1/133305* (2013.01); *G06F 1/1652* (2013.01); *H01L 51/0097* (2013.01); *H05K 7/20963* (2013.01); *H05K 9/0054* (2013.01); *H01L 2251/5338* (2013.01); *H04M 1/0268* (2013.01)

(58) Field of Classification Search
CPC .... G06F 1/1652; G06F 1/1616; G06F 1/1641; H01L 2251/5338; H04M 1/0268; G09F 9/301; H05K 1/028; H05K 5/0017; H05K 7/20963; H05K 9/0054; G02B 5/20
See application file for complete search history.

(56) References Cited

U.S. PATENT DOCUMENTS

| | | | |
|---|---|---|---|
| 2008/0095995 A1 | 4/2008 | Cha et al. | |
| 2009/0021666 A1* | 1/2009 | Chen ................. | G02F 1/133305 349/58 |
| 2014/0092034 A1* | 4/2014 | Franklin ............. | G09F 13/0413 345/173 |
| 2014/0183473 A1* | 7/2014 | Lee ..................... | H01L 51/0097 257/40 |

(Continued)

FOREIGN PATENT DOCUMENTS

| | | |
|---|---|---|
| KR | 10-0816870 B1 | 3/2008 |
| KR | 10-2018-0006530 | 1/2018 |
| KR | 10-2018-0021333 A | 3/2018 |

*Primary Examiner* — James Wu
(74) *Attorney, Agent, or Firm* — Innovation Counsel LLP

(57) ABSTRACT

A flexible display device may include a display module including a first non-bending area and a first bending area adjacent to the first non-bending area, and a cushion layer disposed on a rear surface of the display module, wherein the cushion layer has a first density in the first non-bending area and a second density in the first bending area, and the first density is lower than the second density.

20 Claims, 11 Drawing Sheets

(56) References Cited

U.S. PATENT DOCUMENTS

| | | | |
|---|---|---|---|
| 2014/0240614 A1* | 8/2014 | Ahn | H01L 27/323 349/12 |
| 2015/0016126 A1* | 1/2015 | Hirakata | F21V 15/012 362/418 |
| 2015/0109544 A1* | 4/2015 | Yeo | G02F 1/133305 349/12 |
| 2016/0198582 A1 | 7/2016 | Yun et al. | |
| 2018/0013080 A1* | 1/2018 | Kim | H01L 27/3272 |
| 2018/0052355 A1 | 2/2018 | Jeong | |

* cited by examiner

FLEXIBLE DISPLAY DEVICE

RELATED APPLICATIONS

The present application claims priority under 35 U.S.C. 119(a) to Korean Patent Application No. 10-2016-0131565, filed on Oct. 11, 2016, in the Korean Intellectual Property Office, the disclosure of which is incorporated herein by reference in its entirety.

BACKGROUND

1. Field

An aspect of the present disclosure relates to a flexible display device.

2. Description of the Related Art

A demand for portable display devices has been increased, and recently, there has been an increasing interest in flexible display devices that can be bent or folded by an external force applied from a user.

The flexible display device may be subjected to an external impact. The flexible display device is desired to have a uniform impact resistance.

SUMMARY

According to an aspect of the present disclosure, there is provided a flexible display device having a uniform impact resistance for a bending area and a non-bending area.

In addition, according to an aspect of the present disclosure, there is a provided a touch screen display device having touch sensitivity corresponding to the characteristic of each of a plurality of areas.

According to an aspect of the present disclosure, there is provided a flexible display device including a display module including a first non-bending area and a first bending area adjacent to the first non-bending area, and a cushion layer disposed on a rear surface of the display module, wherein the cushion layer has a first density in the first non-bending area, and a second density in the first bending area, wherein the first density is lower than the second density.

According to one embodiment, the first bending area may be disposed on at least one side of the first non-bending area when viewed from a plane.

The display module may further include a second non-bending area, the first bending area may be disposed between the first non-bending area and the second non-bending area, and the cushion layer may have a third density in the second non-bending area, wherein the third density may be lower than the second density.

The display module may further include a second bending area and a third non-bending area, the second bending area may be disposed between the second non-bending area and the third non-bending area, the cushion layer may have a fourth density in the second bending area and a fifth density in the third non-bending area, and the fourth density may be higher than the third density and the fifth density.

The display module may further include a second non-bending area adjacent to the first non-bending area, the first non-bending area may be disposed between the second non-bending area and the first bending area, the cushion layer may have a third density in the second non-bending area, and the third density may be lower than the first density.

The display module may further include a second bending area adjacent to the first bending area, the first bending area may be disposed between the second bending area and the first non-bending area, and the cushion layer may have a third density in the second bending area, and the third density may be higher than the second density.

The display module may further include a second bending area, a third bending area, and a fourth bending area, the cushion layer may have a third density in the second bending area, a fourth density in the third bending area, and a fifth density in the fourth bending area, and each of the third density, the fourth density, and the fifth density may be higher than the first density.

The first bending area may extend from a first side of the first non-bending area, the second bending area may extend from a second side of the first non-bending area, the third bending area may extend from a third side of the first non-bending area, and the fourth bending area may extend from a fourth side of the first non-bending area, and the first side and the second side may be adjacent to the third side and the fourth side, respectively, when viewed from a plane.

The cushion layer may include a sponge.

The sponge may include at least one of polyurethane, polystyrene, polyolefin, polyamide, synthetic rubber, polydimethylsiloxane, polybutadiene, polyisobutylene, polychloroprene, polyethylene, silicone, and any combination thereof.

The flexible display device may further include an electromagnetic wave shielding layer disposed on a rear surface of the cushion layer.

A flexible display device may include a display module including a first non-bending area and a first bending area adjacent to the first non-bending area, a cushion layer disposed on a rear surface of the display module, and an electromagnetic wave shielding layer disposed on a rear surface of the cushion layer, wherein the electromagnetic wave shielding layer may be arranged in the first non-bending area, the cushion layer may have a first density in the first non-bending area, and a second density in the first bending area, wherein the first density may be lower than the second density.

The electromagnetic wave shielding layer may include at least one of nickel, iron, titanium, zirconium, vanadium, neodymium, tantalum, chromium, molybdenum, tungsten, manganese, ruthenium, cobalt, rhodium, palladium, platinum, copper, silver, gold, zinc, cadmium, aluminum, gallium, indium, and an alloy thereof, and the electromagnetic wave shielding layer may emit heat generated from the display module to an outside of the flexible display device.

The display module may further include a second non-bending area, and the first bending area may be disposed between the first non-bending area and the second non-bending area, the cushion layer may have a third density in the second non-bending area, the third density may be lower than the second density, wherein the electromagnetic wave shielding layer may further include a first electromagnetic wave shielding layer disposed in the first non-bending area, and a second electromagnetic wave shielding layer disposed in the second non-bending area, and wherein the first electromagnetic wave shielding layer and the second electromagnetic wave shielding layer area may be spaced apart from each other.

The electromagnetic wave shielding layer may further include a third electromagnetic wave shielding layer disposed in the first bending area, wherein the third electromagnetic wave shielding layer may be spaced apart from the first electromagnetic wave shielding layer and the second electromagnetic wave shielding layer.

The flexible display device may further include a first adhesive layer disposed between the cushion layer and the electromagnetic wave shielding layer and a second adhesive layer disposed between the cushion layer and the display module.

Each of the first adhesive layer and the second adhesive layer may include at least one of an optically clear adhesive (OCA) and an optically clear resin (OCR).

The first adhesive layer and the second adhesive layer may be opaque.

The flexible display device may further include a light shielding layer disposed between the second adhesive layer and the display module.

The light shielding layer may include at least one of polyimide, polyethylene terephthalate, carbon black, aniline black, and any combination thereof.

DETAILED DESCRIPTION

Figure 1A:
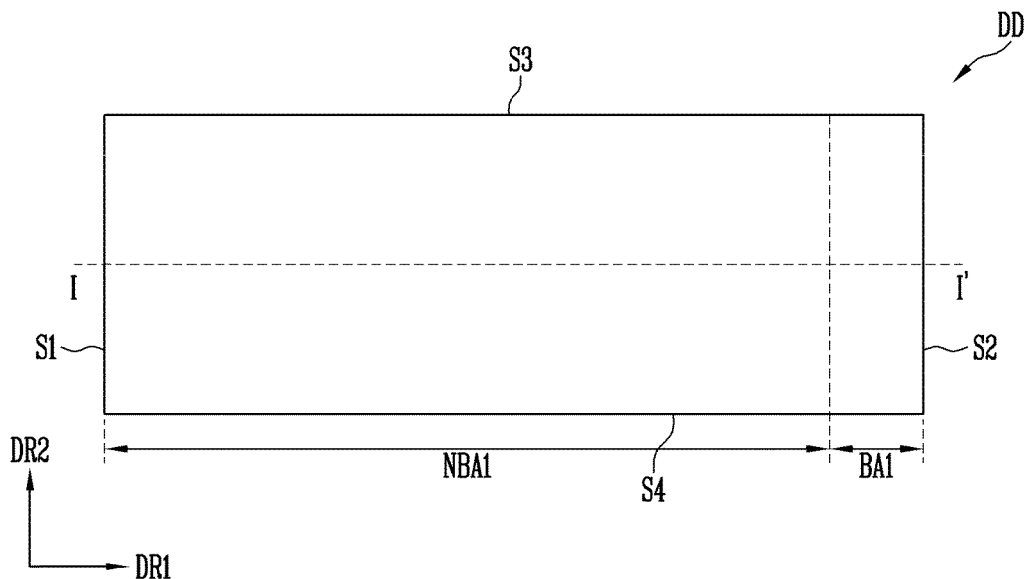
FIG. 1A is a view illustrating a flexible display device, according to one embodiment of the present disclosure.

Hereinafter, preferred embodiments of the present disclosure will be described in detail with reference to the accompanying drawings. Like reference numerals throughout the specification may denote substantially like elements. In the following description, a detailed description of known functions and configurations related to the present disclosure may be omitted when it may make the subject matter of the present disclosure rather unclear. In addition, the name of the constituent elements used in the following description may be selected in consideration of ease of specification to be different from the names of the components of actual products.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In addition, when a portion such as a layer, film, region, plate, or the like is referred to as "above" the other portion, it includes not only the case where it is "directly over" another portion, in the present specification, when a portion of a layer, a film, an area, a plate, or the like is formed on another portion, the forming direction is not limited to an upper portion but includes a portion formed in a side or a lower direction. On the contrary, when a portion such as a layer, film, region, plate, or the like is referred to as being "under" another section, this includes not only the case where the section is "directly underneath."

Figure 1B:
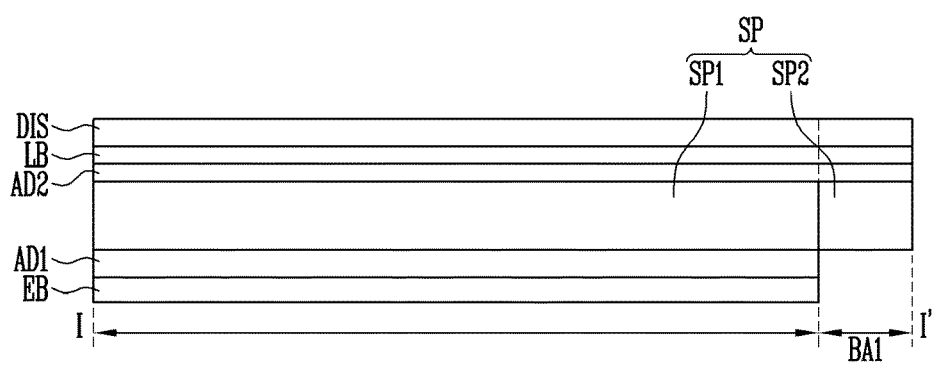
FIG. 1B is a cross-sectional view taken along line I-I' of FIG. 1A.
Figure 1C:
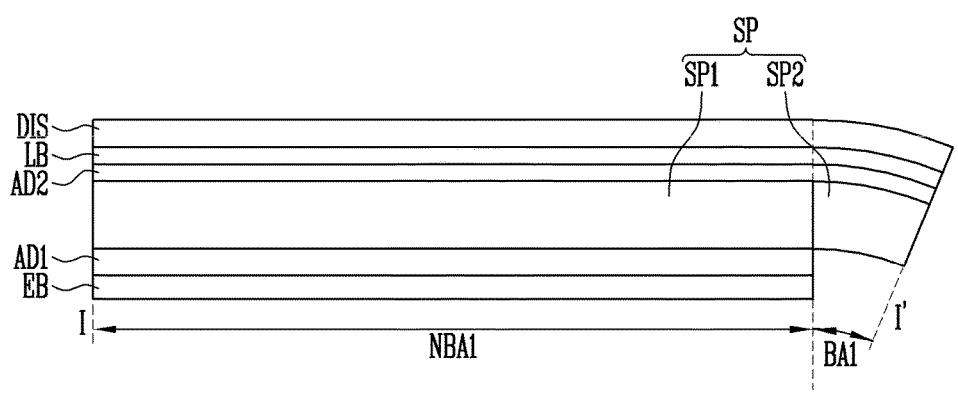
FIGS. 1C and 1D are views illustrating a bending of a first bending area of the flexible display device of FIG. 1A.
Figure 1D:
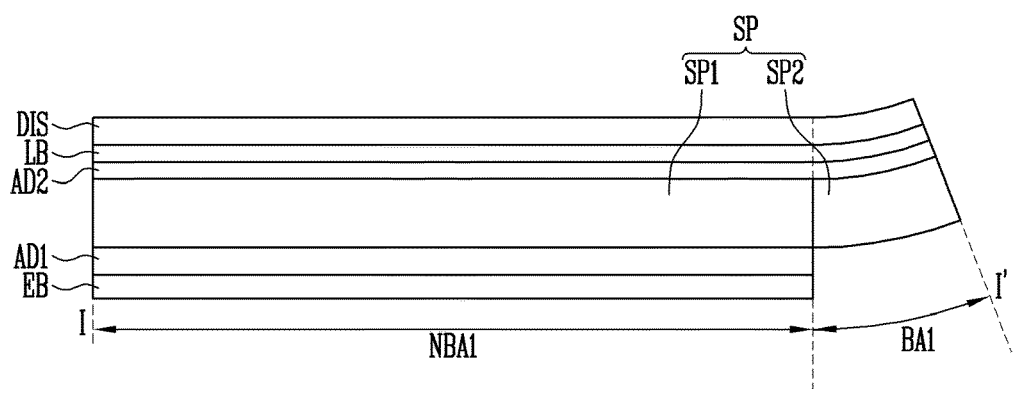

FIG. 1A is a view illustrating a flexible display device, according to one embodiment of the present disclosure. FIG. 1B is a cross-sectional view taken along line I-I' of FIG. 1A, and FIGS. 1C and 1D are views illustrating a bending of a first bending area of the flexible display device of FIG. 1A.

Referring to FIGS. 1A and 1B, a display device DD may include a display module DIS, a cushion layer SP, an electromagnetic wave shielding layer EB, a first adhesive layer AD1, a second adhesive layer AD2, and a light shielding layer LB.

The display module DIS may include a first non-bending area NBA1 and a first bending area BA1, and the first bending area BA1 may be disposed on at least one side of the first non-bending area NBA1. A front surface of the display module DIS may display an image, and the display module DIS may be bendable. The display module DIS may include at least one of a liquid crystal display device, a plasma display device, and an organic light emitting display device, but the type of the display module DIS is not particularly limited thereto. As shown in FIG. 1A, the shape of the display module DIS may be rectangular, but the present disclosure is not limited thereto.

A first side S1 and a second side S2 of the display module DIS may extend in a second direction DR2 to be in parallel to each other, but the present disclosure is not limited thereto. For example, the first side S1 and the second side S2 may not be in parallel. In such a case, extension directions of the first side S1 and the second side S2 of the display module DIS may intersect with each other. The first side S1 and the second side S2 of the display module DIS may be adjacent to a third side S3 and a fourth side S4 of the display module DIS, respectively, when viewed from a plane. The third side S3 and the fourth side S4 of the display module DIS may extend in a first direction DR1 to be parallel to each other, but the present disclosure not limited thereto. For example, the third side S3 and the fourth side S4 may not be in parallel. In such a case, the third side S3 and the fourth side S4 of the display module DIS may intersect with each other.

The cushion layer SP may be disposed on a rear surface of the display module DIS. The cushion layer SP may include a first cushion layer SP1 and a second cushion layer SP2. The first cushion layer SP1 may be disposed on the first non-bending area NBA1, and the second cushion layer SP2 may be disposed on the first bending area BA1. The cushion layer SP may have a first density in the first non-bending area NBA1 and a second density in the first bending area BA1, and the first density may be different from the second density. The first cushion layer SP1 may have the first density, and the second cushion layer SP2 may have the second density.

The cushion layer SP may include a sponge, and the sponge may include at least one of polyurethane, polystyrene, polyolefin, polyamide, synthetic rubber, polydimethylsiloxane, polybutadiene, polyisobutylene, polychloroprene, polyethylene, silicone, and any combination thereof.

The cushion layer SP may absorb an impact applied to the rear surface of the display module DIS.

The electromagnetic wave shielding layer EB may be disposed on the rear surface of the cushion layer SP and in the first non-bending area NBA.

The electromagnetic wave shielding layer EB may include a metal for shielding electromagnetic waves, and the metal may include nickel, iron, titanium, zirconium, vanadium, neodymium, tantalum, chromium, molybdenum, tungsten, manganese, ruthenium, cobalt, rhodium, palladium, platinum, copper, silver, gold, zinc, cadmium, aluminum, gallium, indium, and any alloy thereof. For example, the electromagnetic wave shielding layer EB may include an invar-based alloy including iron and nickel.

The electromagnetic wave shielding layer EB may not only shield electromagnetic waves generated from the display module DIS but also radiate heat generated from the display module DIS to an outside of the display device DD.

The first adhesive layer AD1 may be disposed between the cushion layer SP and the electromagnetic wave shielding layer EB. The first adhesive layer AD1 may be disposed in the first non-bending area NBA.

The first adhesive layer AD1 may be transparent and include at least one of an optically clear adhesive (OCA) and an optically clear resin (OCR). Alternatively, the first adhesive layer AD1 may be opaque.

The first adhesive layer AD1 may prevent the cushion layer SP from being separated from the electromagnetic wave shielding layer EB.

The second adhesive layer AD2 may be disposed between the display module DIS and the cushion layer SP.

The second adhesive layer AD2 may be transparent and include at least one of an optically clear adhesive (OCA) and an optically clear resin (OCR). Alternatively, the second adhesive layer AD2 may be opaque and include a double-sided adhesive tape.

The second adhesive layer AD2 may prevent the cushion layer SP from being separated from the display module DIS.

The light shielding layer LB may be disposed between the second adhesive layer AD2 and the display module DIS. The light shielding layer LB may include at least one of polyimide, polyethylene terephthalate, carbon black, aniline black, and any combination thereof. For example, the light shielding layer LB may include a film including at least one of polyimide and polyethylene terephthalate and a black ink disposed on the film and blocking light. The black ink may include at least one of carbon black and aniline black.

The light shielding layer LB may prevent the light generated in the display module DIS from leaking in a direction of the rear surface.

Since the cushion layer SP is disposed on the rear surface of the display module DIS, the impact applied to the rear surface of the display module DIS may be absorbed by the cushion layer SP.

The density of the first cushion layer SP1 and the density of the second cushion layer SP2 may be selected so that an impact resistance in the first non-bending area NBA1 is substantially the same as an impact resistance in the first bending area BA1. Table 1 shows a result of a pen drop experiment.

TABLE 1

| Pen drop characteristic | | Density(g/cm³) | | |
|---|---|---|---|---|
| reduction rate (%) | | 0.3 | 0.7 | 0.9 |
| Thickness (μm) | 60 | — | 11 | 0 |
| | 100 | 27 | 33 | 9 |
| | 150 | — | 30 | — |
| | 200 | — | 60 | — |

(—: Not performed)

In the pen drop experiment, a pen (e.g., a Fine BiC pen manufactured by Societe Bic) having a diameter of 0.07 mm and a weight of 5.7 g including a lid fell free from different falling heights onto the display module DIS. A pen drop characteristic reduction rate may be defined as follows.

$$PDR = \frac{(H1 - H2)}{H1} \qquad \text{[Equation 1]}$$

Where PDR is a pen drop characteristic reduction rate; H1 is a critical height at which the display module DIS is free of scratches when a pen falls free to the display module DIS on which the cushion layer SP is not disposed; and H2 is a critical height at which the display module DIS is free of scratches when the pen falls free on the display module DIS on which the cushion layer SP is disposed on a rear side of the display module DIS.

Referring to Table 1, when the cushion layer has a uniform thickness, the pen drop characteristics reduction rate may decrease as the density of the cushion layer increases. That is, as the density of the cushion layer SP increases, the impact resistance of the display device DD may increase.

The density of the first cushion layer SP1 and the density of the second cushion layer SP2 may be selected in consideration of the impact resistance. For example, when an electromagnetic wave shielding layer EB is disposed only in the first non-bending area NBA1 and the density of the first cushion layer SP1 is the same as that of the second cushion layer SP2, the impact resistance of the first bending area BA1 may be lower than the impact resistance of the first non-bending area NBA1. That is, the impact resistance of the display device DD may vary depending on a position in the display device DD. However, when the density of the second cushion layer SP2 is lower than the density of the first cushion layer SP1, the impact resistance of the display device DD may be made to be uniform regardless of a position in the display device DD. For example, the density of the first cushion layer SP1 may be between 0.3 g/cm³ and 0.7 g/cm³, and the density of the second cushion layer SP2 may be between 0.7 g/cm³ and 1.3 g/cm³.

Referring to FIG. 1C, the first bending area BA1 may be bendable. An image may be displayed on the front surface of the display module DIS, and the display module DIS may be convexly curved toward the front surface of the display module DIS.

Referring to FIG. 1D, the first bending area BA1 may be bendable. An image may be displayed on the front surface of the display module DIS, and the display module DIS may be concavely curved toward the front surface of the display module DIS.

Figure 2A:
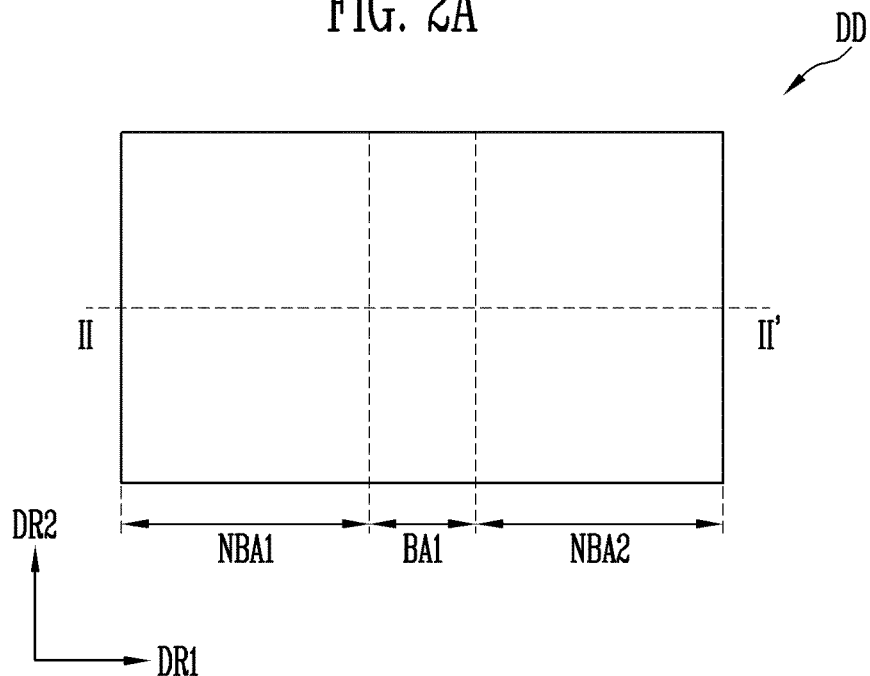
FIG. 2A is a view illustrating a flexible display device, according to another embodiment of the present disclosure.
Figure 2B:
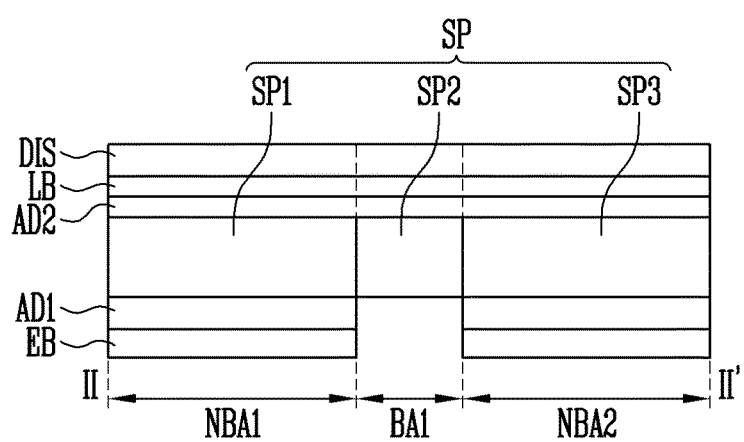
FIG. 2B is a cross-sectional view taken along line II-II' of FIG. 2A.
Figure 2C:
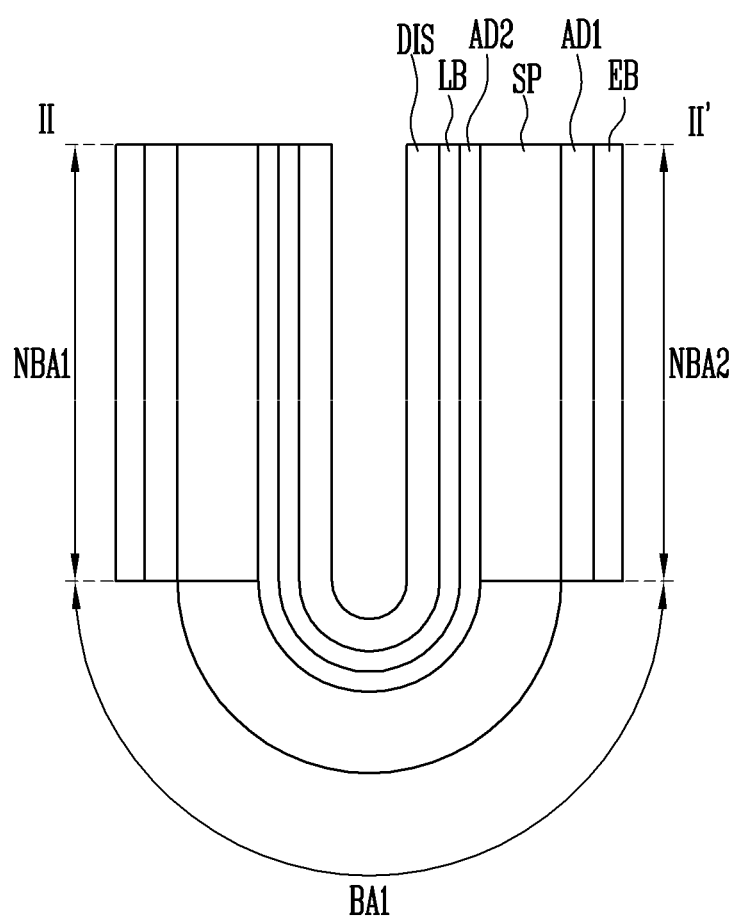
FIG. 2C is a view illustrating a bending of a first bending area of the flexible display device of FIG. 2A.

FIG. 2A is a view illustrating a flexible display device, according to another embodiment of the present disclosure. FIG. 2B is a cross-sectional view taken along line II-II' of FIG. 2A, and FIG. 2C is a view illustrating a bending of a first bending area of the flexible display device of FIG. 2A. In FIGS. 2A to 2C, differences from the display device according to the above-described embodiment will be mainly described to avoid redundancy. Descriptions that are not particularly described in the present embodiment follow those of the display device according to the above-described embodiment. In addition, identical reference numerals refer to identical components, and similar reference numerals refer to similar components.

Referring to FIGS. 2A and 2B, a display device DD may include a display module DIS, a cushion layer SP, an electromagnetic wave shielding layer EB, a first adhesive layer AD1, the second adhesive layer AD2, and a light shielding layer LB.

The display module DIS may include a first non-bending area NBA1, a first bending area BA1, and a second non-bending area NBA2.

The cushion layer SP may include the first cushion layer SP1, the second cushion layer SP2, and a third cushion layer SP3. The first cushion layer SP1 may be disposed in the first non-bending area NBA1, the second cushion layer SP2 may be disposed in the first bending area BA1, and the third cushion layer SP3 may be disposed in the second non-bending area NBA2.

The cushion layer SP may have a first density in the first non-bending area NBA1, a second density in the first bending area BA1, and a third density in the second non-bending area NBA2. The first density, the second density, and the third density may be selected so that the impact resistance of the display device DD is made to be uniform.

The first adhesive layer AD1 may be disposed in the first non-bending area NBA1 and the second non-bending area NBA2.

The electromagnetic wave shielding layer EB may be disposed only in the first non-bending area NBA1 and the second non-bending area NBA2. The density of the second cushion layer SP2 may be higher than that of the first cushion layer SP1 and that of the third cushion layer SP3.

Referring to FIG. 2C, the first bending area BA1 may be bendable.

An image may be displayed on the front surface of the display module DIS. Since the first bending area BA1 is curved, the front surface in the first non-bending area NBA1 of the display module DIS may face the front surface in the second non-bending area NBA2 of the display module DIS.

According to another embodiment, the first bending area BA1 may be curved in an opposite direction. In such a case, the rear surface of the electromagnetic wave shielding layer EB in the first non-bending area NBA1 may face the rear surface of the electromagnetic wave shielding layer EB in the second non-bending area NBA2.

Figure 3A:
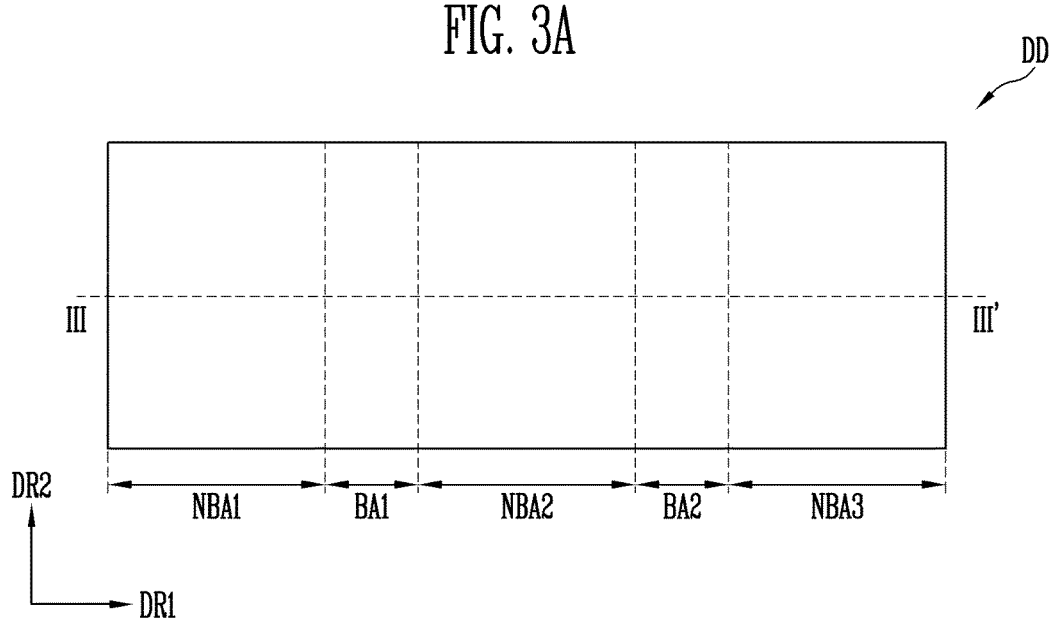
FIG. 3A is a view illustrating a flexible display device, according to another embodiment of the present disclosure.
Figure 3B:
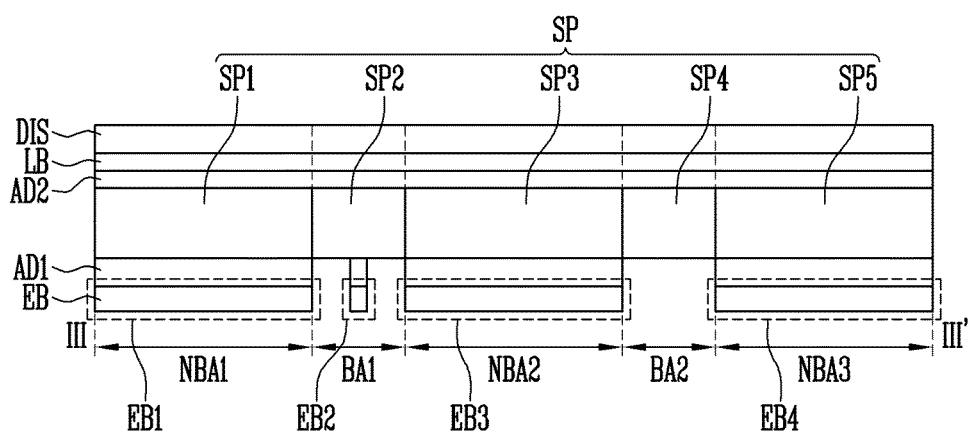
FIG. 3B is a cross-sectional view taken along line III-III' of FIG. 3A.
Figure 3C:
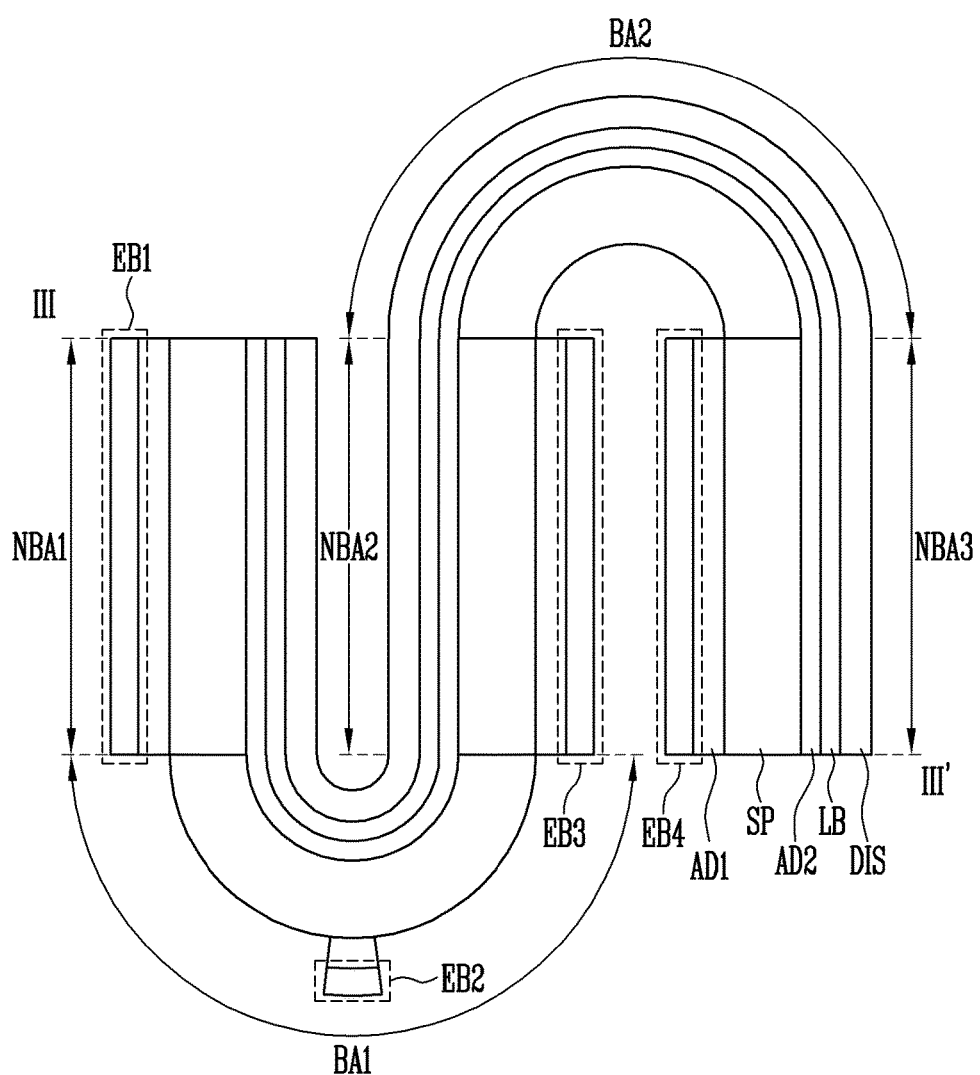
FIG. 3C is a view illustrating a bending of a first bending area and a second bending area of the flexible display device of FIG. 3A.

FIG. 3A is a view illustrating a flexible display device, according to another embodiment of the present disclosure. FIG. 3B is a cross-sectional view taken along line III-III' of FIG. 3A, and FIG. 3C is a view illustrating a bending of a first bending area and a second bending area of the flexible display device of FIG. 3A. In FIGS. 3A to 3C, differences from the display device according to the above-described embodiment will be mainly described to avoid redundancy. Descriptions that are not particularly described in the present embodiment follow those of the display device according to the above-described embodiment. In addition, identical reference numerals refer to identical components, and similar reference numerals refer to similar components.

Referring to FIGS. 3A and 3B, a display device DD may include a display module DIS, a cushion layer SP, an electromagnetic wave shielding layer EB, a first adhesive layer AD1, a second adhesive layer AD2 and a light shielding layer LB.

The display module DIS may include a first non-bending area NBA1, a first bending area BA1, a second non-bending area NBA2, a second bending area BA2, and a third non-bending area NBA3.

The cushion layer SP may include a first cushion layer SP1, a second cushion layer SP2, a third cushion layer SP3, a fourth cushion layer SP4, and a fifth cushion layer SP5. The first cushion layer SP1 may be disposed in the first non-bending area NBA1, the second cushion layer SP2 may be disposed in the first bending area BA1, the third cushion layer SP3 may be disposed in the second non-bending area NBA2, the fourth cushion layer SP4 may be disposed in the second bending area BA2, and the fifth cushion layer SP5 may be disposed in the third non-bending area NBA3.

The cushion layer SP may have a first density in the first non-bending area NBA1, a second density in the first bending area BA1, a third density in the second non-bending area NBA2, a fourth density in the second bending area BA2, and a fifth density in the third non-bending area NBA3.

The first to fifth densities may be selected so that the display device DD may have a uniform impact resistance.

The electromagnetic wave shielding layer EB may include a first electromagnetic wave shielding layer EB1, a second electromagnetic wave shielding layer EB2, a third electromagnetic wave shielding layer EB3, and a fourth electromagnetic wave shielding layer EB4. The first electromagnetic wave shielding layer EB1 may be disposed in the first bending area NBA1, the second electromagnetic wave shielding layer EB2 may be disposed in the first bending area BA1 overlapped with a portion of the second cushion layer SP2, the third electromagnetic wave shielding layer EB3 may be disposed in the second non-bending area NBA2, and the fourth electromagnetic wave shielding layer EB4 may be disposed in the third non-bending area NBA3. The first electromagnetic wave shielding layer EB1, the second electromagnetic wave shielding layer EB2, the third electromagnetic wave shielding layer EB3, and the fourth electromagnetic wave shielding layer EB4 may be disposed to be spaced apart from one another.

The first adhesive layer AD1 may also be disposed in the first non-bending area NBA1, the second non-bending area NBA2, the third non-bending area NBA3, and the first bending area BA1 overlapped with a portion of the second cushion layer SP2.

An electromagnetic wave shielding layer EB may be disposed in the first non-bending area NBA1, the second non-bending area NBA2, and the third non-bending area NBA3, and a portion of the first bending area BA1. A density of the second cushion layer SP2 may be higher than the density of the first cushion layer SP1 and a density of the third cushion layer SP3, and a density of the fourth cushion layer SP4 may be higher than a density of the third cushion layer SP3 and a density of the fifth cushion layer SP5.

Referring to FIG. 3C, the first bending area BA1 and the second bending area BA2 may be curved.

As the first bending area BA1 is curved, the front surface of the display module DIS in the first non-bending area NBA1 may face the front surface of the second non-bending area NBA2 of the display module DIS.

As the second bending area BA2 is curved, the rear surface of the third electromagnetic wave shielding layer EB3 may face the rear surface of the electromagnetic wave shielding layer EB4 in the third non-bending area NBA3.

According to another embodiment, the first bending area BA1 and the second bending area BA2 may be curved in opposite directions. In such a case, the rear surface of the display module DIS in the first non-bending area NBA1 may face the rear surface of the second non-bending area NBA2 of the display module DIS, and the front surface of the third electromagnetic wave shielding layer EB3 may face the front surface of the electromagnetic wave shielding layer EB4 in the third non-bending area NBA3. In this case, the second electromagnetic wave shielding layer EB2 may be disposed in the second bending area BA2 overlapped with a portion of the fourth cushion layer SP4.

Figure 4A:
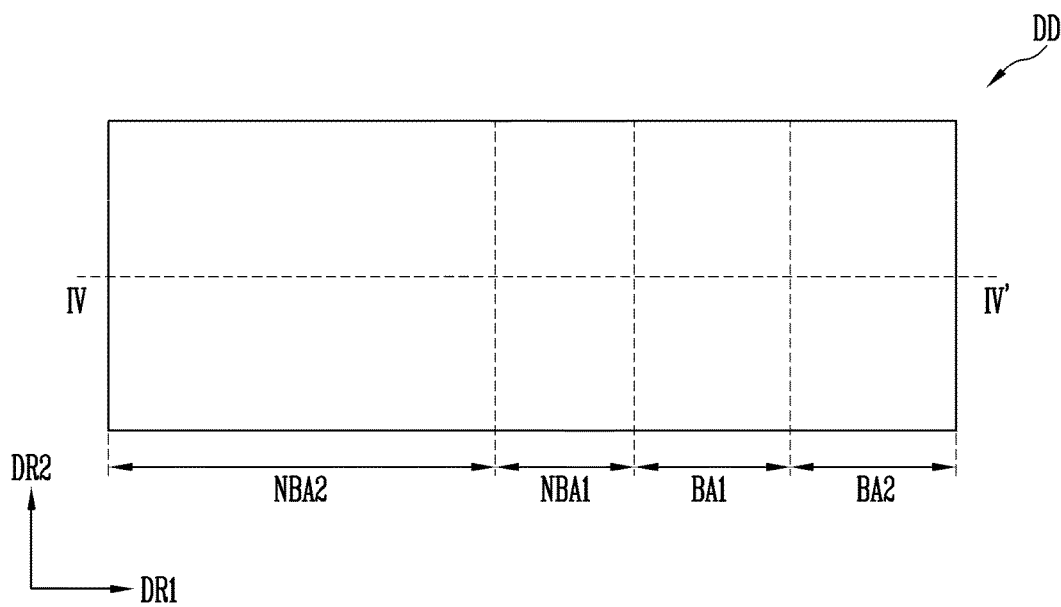
FIG. 4A is a view illustrating a flexible display device, according to another embodiment of the present disclosure.
Figure 4B:
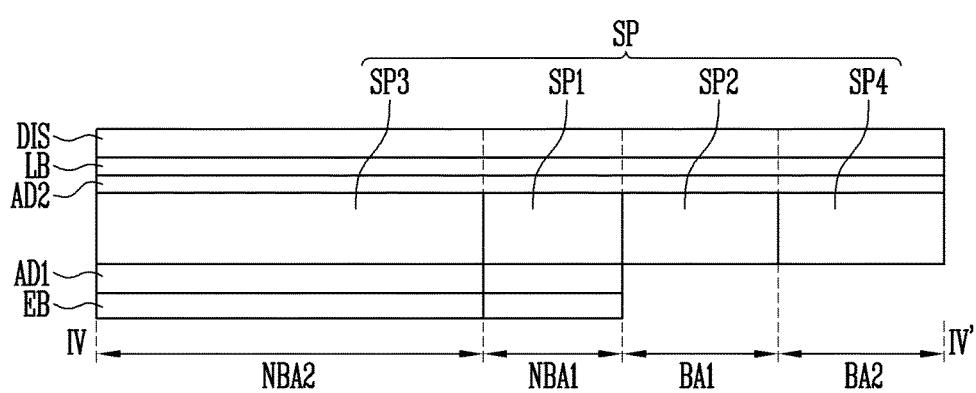
FIG. 4B is a cross-sectional view taken along line IV-IV' of FIG. 4A.
Figure 4C:
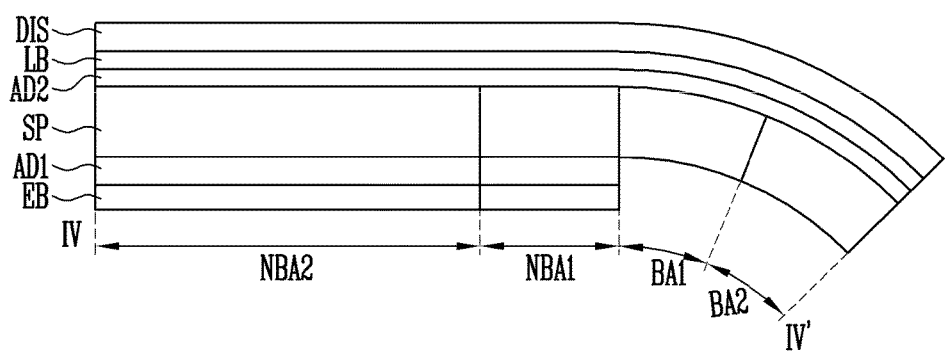
FIG. 4C is a view illustrating a bending of a first bending area and a second bending area of the flexible display device of FIG. 4A.

FIG. 4A is a view illustrating a flexible display device, according to another embodiment of the present disclosure. FIG. 4B is a cross-sectional view taken along line IV-IV' of FIG. 4A and FIG. 4C is a view illustrating a bending of a first bending area and a second bending area of the flexible display device of FIG. 4A. In FIGS. 4A to 4C, differences from the display device according to the above-described embodiment will be mainly described to avoid redundancy. Descriptions that are not particularly described in the present embodiment follow those of the display device according to the above-described embodiment. In addition, identical reference numerals refer to identical components, and similar reference numerals refer to similar components.

Referring to FIGS. 4A and 4B, a display device DD may include a display module DIS, a cushion layer SP, an electromagnetic wave shielding layer EB, a first adhesive layer AD1, a second adhesive layer AD2 and a light shielding layer LB.

The display module DIS may include a first non-bending area NBA1, a second non-bending area NBA2, a first bending area BA1, and a second bending area BA2. The non-bending area NBA1 may be disposed between the second non-bending area NBA2 and the first bending area BA1, and the first bending area BA1 may be disposed between the first non-bending area NBA1 and the second bending area BA2.

The cushion layer SP may include a first cushion layer SP1, a second cushion layer SP2, a third cushion layer SP3, and a fourth cushion layer SP4. The first cushion layer SP1 may be disposed in the first non-bending area NBA1, the second cushion layer SP2 may be disposed in the first bending area BA1, the third cushion layer SP3 may be disposed in the second non-bending area NBA2, and the fourth cushion layer SP4 may be disposed in the second bending area BA2.

The electromagnetic wave shielding layer EB may be disposed in the first non-bending area NBA1 and the second non-bending area NBA2.

The first adhesive layer AD1 may be disposed in the first non-bending area NBA1 and the second non-bending area NBA2.

A density of the first cushion layer SP1 may be lower than a density of the second cushion layer SP2 and higher than that of the third cushion layer SP3, and the density of the second cushion layer SP2 may be higher than that of the fourth cushion layer SP4 and higher than the density of the first cushion layer SP1. According to one embodiment, the density of the cushion layer SP may continuously increase in the first direction DR1.

Referring to FIG. 4C, the first bending area BA1 and the second bending area BA2 may be curved.

Due to the bending of the first bending area BA1 and the second bending area BA2, the display module DIS may be convexly curved toward the front surface of the display module DIS.

According to another embodiment, since the first bending area BA1 and the second bending area BA2 are curved in opposite directions, the display module DIS may be concavely curved toward the front face of the display module DIS in a similar fashion as shown in FIG. 1D.

Figure 5A:
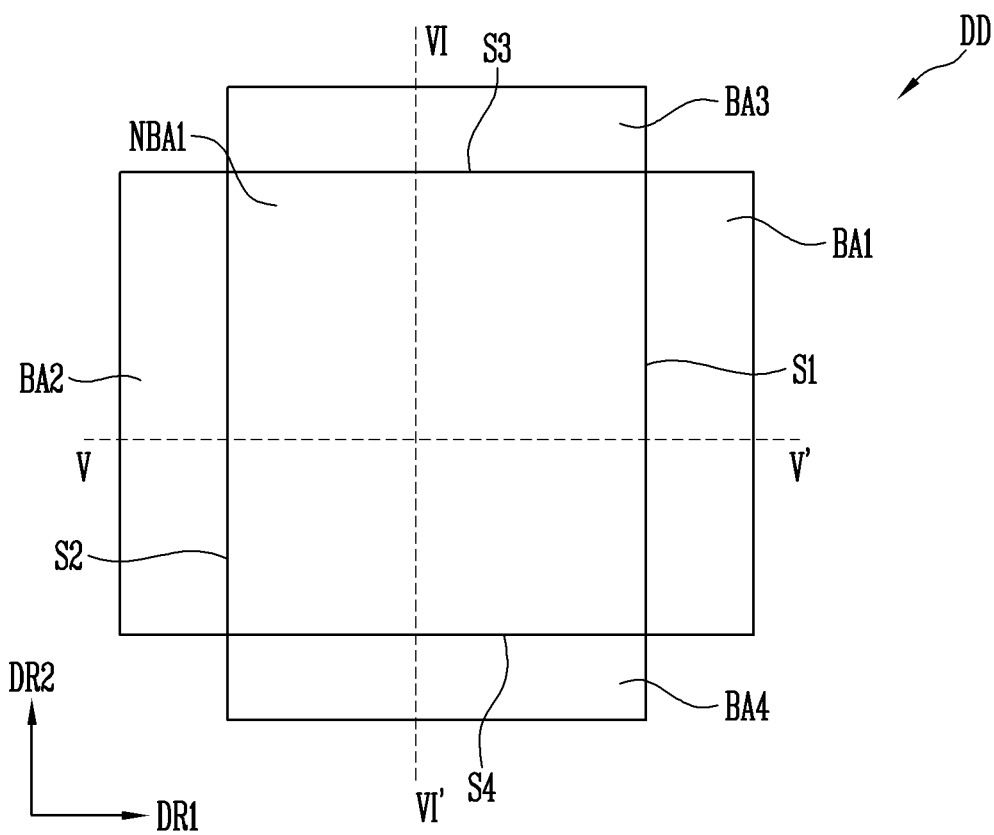
FIG. 5A is a view illustrating a flexible display device, according to another embodiment of the present disclosure.
Figure 5B:
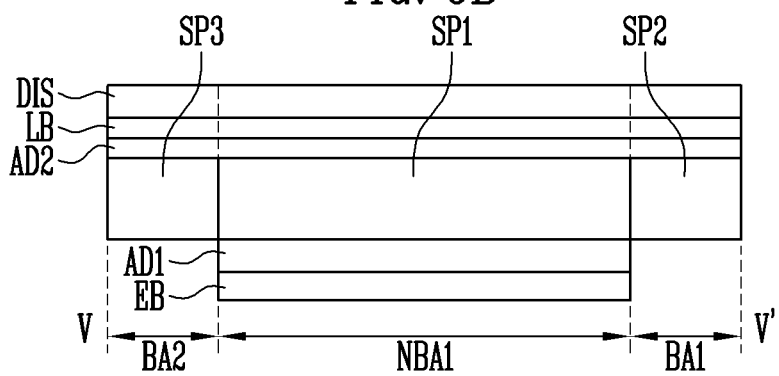
FIG. 5B is an embodiment of a cross-sectional view taken along line V-V' of FIG. 5A.
Figure 5C:
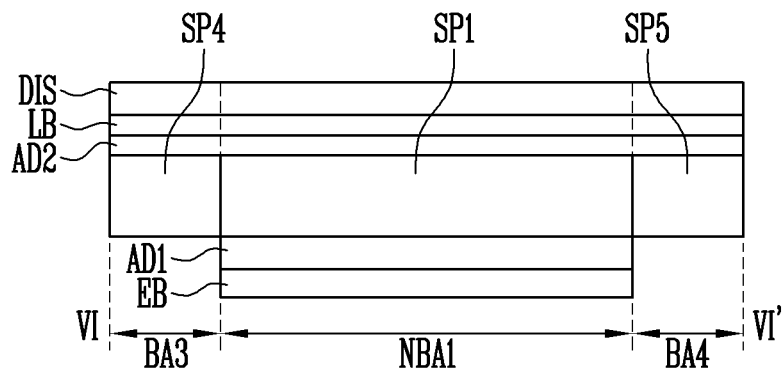
FIG. 5C is an embodiment of a cross-sectional view taken along line VI-VI' of FIG. 5A.
Figure 5D:
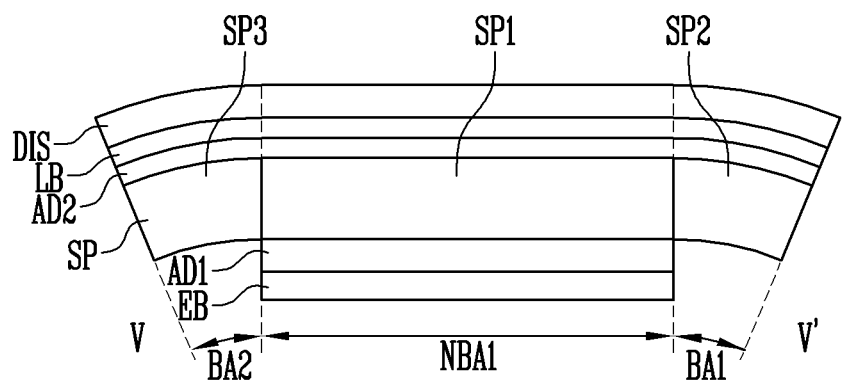
FIG. 5D is a view illustrating a bending of a first bending area and a second bending area of the flexible display device of FIG. 5A.
Figure 5E:
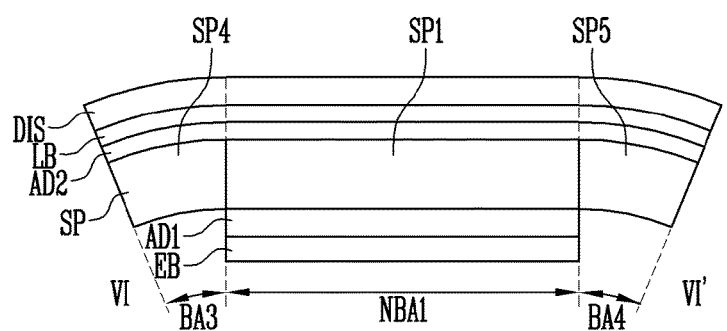
FIG. 5E is a view illustrating a bending of a third bending area and a fourth bending area of the flexible display device of FIG. 5A.

FIG. 5A is a view illustrating a flexible display device. according to another embodiment of the present disclosure. FIG. 5B is an embodiment of a cross-sectional view taken along line V-V' of FIG. 5A, FIG. 5C is an embodiment of a cross-sectional view taken along line VI-VI' of FIG. 5A, FIG. 5D is a view illustrating a bending of a first bending area and a second bending area of the flexible display device of FIG. 5A, and FIG. 5E is a view illustrating a bending of a third bending area and a fourth bending area of the flexible display device of FIG. 5A. In FIGS. 5A to 5E, differences from the display device according to the above-described embodiment will be mainly described to avoid redundancy. Descriptions that are not particularly described in the present embodiment follow those of the display device according to the above-described embodiment. In addition, identical reference numerals refer to identical components, and similar reference numerals refer to similar components.

Referring to FIGS. 5A, 5B and 5C, a display device DD may include a display module DIS, a first cushion layer SP1, a second cushion layer SP2, a third cushion layer SP3, a fourth cushion layer SP4, a fifth cushion layer SP5, an electromagnetic wave shielding layer EB, a first adhesive layer AD1, a second adhesive layer AD2 and a light shielding layer LB.

The display module DIS may include a first non-bending area NBA1, a first bending area BA1, a second bending area BA2, a third bending area BA3, and a fourth bending area BA4.

The first bending area BA1 may contact a first side S1 of the first non-bending area NBA1, the second bending area BA2 may contact a second side S2 of the first non-bending area NBA1, the third bending area BA3 may contact a third side S3 of the first non-bending area NBA1, and the fourth bending area BA4 may contact a fourth side S4 of the first non-bending area NBA1.

Each of the first side S1 and the second side S2 of the first non-bending area NBA1 may be adjacent to the third side S3 and the fourth side S4 of the first non-bending area NBA1.

The first cushion layer SP1, the second cushion layer SP2, the third cushion layer SP3, the fourth cushion layer SP4, and the fifth cushion layer SP5 may be disposed on the rear surface of the display module DIS. The first cushion layer SP1, the second cushion layer SP2, the third cushion layer SP3, the fourth cushion layer SP4, and the fifth cushion layer SP5 may be collectively referred to as a cushion layer SP. The first cushion layer SP1 may be disposed in the first non-bending area NBA1, the second cushion layer SP2 may be disposed in the first bending area BA1, the third cushion layer SP3 may be disposed in the second bending area BA2, the fourth cushion layer SP4 may be disposed in the third bending area BA3, and the fifth cushion layer SP5 may be disposed in the fourth bending area BA4.

Referring to FIG. 5D, the first bending area BA1 and the second bending area BA2 may be curved.

Due to the bending of the first bending area BA1 and the second bending area BA2, the display module DIS may be convexly curved toward the front side of the display module DIS.

According to another embodiment, the first bending area BA1 and the second bending area BA2 may be curved in opposite directions and the display module DIS may be curved concavely toward the front of the display module DIS.

Referring to FIG. 5E, the third bending area BA3 and the fourth bending area BA4 may be curved.

Due to the bending of the third bending area BA3 and the fourth bending area BA4, the display module DIS may be curved convexly toward the front face of the display module DIS.

According to another embodiment, the third bending area BA3 and the fourth bending area BA4 may be curved in the opposite directions, and the display module DIS may be curved concavely toward the front of the display module DIS in a similar fashion as shown in FIG. 1D.

According to one embodiment, a flexible display device having a uniform impact resistance may be provided.

It will be apparent to those skilled in the art that various modifications and variations can be made in the present disclosure without departing from the spirit or scope of the present disclosure. Therefore, the technical scope of the present disclosure should not be limited to the embodiments described in the detailed description of the specification, but should be defined by the claims.

What is claimed is:

1. A flexible display device, comprising:
   a display module including a first non-bending area and a first bending area adjacent to the first non-bending area; and
   a cushion layer disposed on a rear surface of the display module,
   wherein the cushion layer has a first cushion layer having a first density in the first non-bending area and a second cushion layer having a second density in the first bending area, and the first density is lower than the second density in an unfolded state prior to bending the first bending area, and
   wherein the first cushion layer and the second cushion layer are disposed in a same layer and have a uniform thickness.

2. The flexible display device of claim 1, wherein the first bending area is disposed on at least one side of the first non-bending area when viewed from a plane.

3. The flexible display device of claim 1, wherein the display module further comprises a second non-bending area,
   the first bending area is disposed between the first non-bending area and the second non-bending area, and
   the cushion layer has a third cushion layer having a third density in the second non-bending area, and the third density is lower than the second density.

4. The flexible display device of claim 3, wherein the display module further comprises a second bending area and a third non-bending area,
   the second bending area is disposed between the second non-bending area and the third non-bending area,
   the cushion layer has a fourth cushion layer having a fourth density in the second bending area and a fifth cushion layer having a fifth density in the third non-bending area, and
   the fourth density is higher than the third density and the fifth density.

5. The flexible display device of claim 1, wherein the display module further comprises a second non-bending area adjacent to the first non-bending area,
   the first non-bending area is disposed between the second non-bending area and the first bending area,
   the cushion layer has a third cushion layer having a third density in the second non-bending area, and the third density is lower than the first density.

6. The flexible display device of claim 1, wherein the display module further comprises a second bending area adjacent to the first bending area,
   the first bending area is disposed between the second bending area and the first non-bending area, and
   the cushion layer has a third cushion layer having a third density in the second bending area, and the third density is higher than the second density.

7. The flexible display device of claim 1, wherein the display module further comprises a second bending area, a third bending area, and a fourth bending area,
   the cushion layer has a third cushion layer having a third density in the second bending area, a fourth cushion layer having a fourth density in the third bending area, and a fifth cushion layer having a fifth density in the fourth bending area, and
   each of the third density, the fourth density, and the fifth density is higher than the first density.

8. The flexible display device of claim 7, wherein the first bending area extends from a first side of the first non-bending area, the second bending area extends from a second side of the first non-bending area, the third bending area extends from a third side of the first non-bending area, and the fourth bending area extends from a fourth side of the first non-bending area, and
   the first side and the second side are adjacent to the third side and the fourth side, respectively, when viewed from a plane.

9. The flexible display device of claim 1, wherein the cushion layer includes a sponge.

10. The flexible display device of claim 9, wherein the sponge includes at least one of polyurethane, polystyrene, polyolefin, polyamide, synthetic rubber, polydimethylsiloxane, polybutadiene, polyisobutylene, polychloroprene, polyethylene, silicone, and any combination thereof.

11. A flexible display device, comprising:
    a display module including a first non-bending area and a first bending area adjacent to the first non-bending area;
    a cushion layer disposed on a rear surface of the display module; and
    an electromagnetic wave shielding layer disposed on a rear surface of the cushion layer,
    wherein the cushion layer is disposed between the display module and the electromagnetic wave shielding layer,
    wherein the electromagnetic wave shielding layer is disposed in the first non-bending area, the cushion layer has a first cushion layer having a first density in the first non-bending area and a second cushion layer having a second density in the first bending area, and the first density is lower than the second density in an unfolded state prior to bending the first bending area, and
    wherein the first cushion layer and the second cushion layer are disposed in a same layer and have a uniform thickness.

12. The flexible display device of claim 11, wherein the electromagnetic wave shielding layer includes at least one of nickel, iron, titanium, zirconium, vanadium, neodymium, tantalum, chromium, molybdenum, tungsten, manganese, ruthenium, cobalt, rhodium, palladium, platinum, copper, silver, gold, zinc, cadmium, aluminum, gallium, indium, and an alloy thereof, and the electromagnetic wave shielding layer emits heat generated from the display module to an outside of the flexible display device.

13. The flexible display device of claim 11, wherein the display module further comprises a second non-bending area, the first bending area is disposed between the first non-bending area and the second non-bending area, the cushion layer has a third cushion layer having a third density in the second non-bending area, and the third density is lower than the second density, and wherein the electromagnetic wave shielding layer further comprises:

a first electromagnetic wave shielding layer disposed in the first non-bending area; and a second electromagnetic wave shielding layer disposed in the second non-bending area, and wherein the first electromagnetic wave shielding layer and the second electromagnetic wave shielding layer are spaced apart from each other.

14. The flexible display device of claim 13, wherein the electromagnetic wave shielding layer further comprises a third electromagnetic wave shielding layer disposed in the first bending area, and the third electromagnetic wave shielding layer is spaced apart from the first electromagnetic wave shielding layer and the second electromagnetic wave shielding layer.

15. The flexible display device of claim 11, further comprising a first adhesive layer disposed between the cushion layer and the electromagnetic wave shielding layer and a second adhesive layer disposed between the cushion layer and the display module.

16. The flexible display device of claim 15, wherein each of the first adhesive layer and the second adhesive layer includes at least one of an optically clear adhesive (OCA) and an optically clear resin (OCR).

17. The flexible display device of claim 15, wherein the first adhesive layer and the second adhesive layer are opaque.

18. The flexible display device of claim 15, further comprising a light shielding layer disposed between the second adhesive layer and the display module.

19. The flexible display device of claim 18, wherein the light shielding layer includes at least one of polyimide, polyethylene terephthalate, carbon black, aniline black, and any combination thereof.

20. The flexible display device of claim 1, further comprising an electromagnetic wave shielding layer disposed on a rear surface of the cushion layer.

* * * * *